(12) United States Patent
Wu et al.

(10) Patent No.: US 6,835,630 B2
(45) Date of Patent: Dec. 28, 2004

(54) CAPACITOR DIELECTRIC STRUCTURE OF A DRAM CELL AND METHOD FOR FORMING THEREOF

(75) Inventors: Yung-Hsien Wu, Taipei (TW); Cheng-Che Lee, Taichung (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/376,230

(22) Filed: Mar. 3, 2003

(65) Prior Publication Data

US 2003/0236002 A1 Dec. 25, 2003

Related U.S. Application Data

(63) Continuation-in-part of application No. 10/214,191, filed on Aug. 8, 2002, now Pat. No. 6,569,731.

(30) Foreign Application Priority Data

Jun. 19, 2002 (TW) ........................................ 91113348 A

(51) Int. Cl.[7] ................ H01L 21/8234; H01L 21/8244; H01L 21/336; H01L 21/20
(52) U.S. Cl. ...................... 438/381; 438/238; 438/286; 438/396
(58) Field of Search .................................. 438/238, 286, 438/396, 239, 3, 240, 241–259

(56) References Cited

U.S. PATENT DOCUMENTS

| | | | | |
|---|---|---|---|---|
| 5,618,745 A | * | 4/1997 | Kita ............................ | 438/164 |
| 6,346,487 B1 | * | 2/2002 | Buchanan et al. ........... | 438/774 |
| 6,444,592 B1 | * | 9/2002 | Ballantine et al. .......... | 438/770 |
| 6,607,965 B2 | * | 8/2003 | Moradi et al. ............... | 438/398 |
| 6,630,384 B1 | * | 10/2003 | Sun et al. .................... | 438/266 |

FOREIGN PATENT DOCUMENTS

| | | |
|---|---|---|
| JP | 2000-183055 | 6/2000 |
| TW | 440969 | 6/1988 |

* cited by examiner

Primary Examiner—Matthew Smith
Assistant Examiner—Chuong Anh Luu
(74) Attorney, Agent, or Firm—Birch, Stewart, Kolasch & Birch, LLP

(57) ABSTRACT

A capacitor dielectric structure of a deep trench capacitor for a DRAM cell. A semiconductor silicon substrate is provided wit a deep trench. Silicon nitride deposition is used to form a silicon nitride layer on the sidewall and bottom of the deep trench. An oxynitride process with wet oxidation and $N_2O$ reactive gas is used to form an oxynitride layer on the silicon nitride layer. A post oxynitride growth annealing is performed on the oxynitride layer.

8 Claims, 6 Drawing Sheets

CAPACITOR DIELECTRIC STRUCTURE OF A DRAM CELL AND METHOD FOR FORMING THEREOF

This application is CIP patent application of U.S. patent application Ser. No. 10/214,191 filed Aug. 8, 2002 now U.S. Pat. No. 6,569,731.

BACKGROUND OF THE INVENTION

1. Field of the Invention

The present invention relates to a dielectric structure of a deep trench capacitor for a dynamic random access memory (DRAM) cell and, more particularly, to a SiN/SiON dielectric structure for improving capacitance and reducing leakage current and a method of forming thereof.

2. Description of the Related Art

There is much interest in reducing the size of individual semiconductor devices in order to increase their density on an integrated circuit (IC) chip, thereby reducing size and power consumption of the chip, and allowing faster operation. In order to achieve a memory cell with a minimum size, the gate length in a conventional transistor must be reduced to decrease the lateral dimension of the memory cell. However, the shorter gate length will result in higher leakage currents that cannot be tolerated, and the voltage on the bit line must therefore also be scaled down. This reduces the charges stored on a storage capacitor, and thus requires a larger capacitance to ensure that stored charges are sensed correctly. Recently, in fabricating highly-integrated memory devices, such as dynamic random access memory (DRAM), a deep trench capacitor has been developed within a silicon substrate without consuming any additional wafer area.

In order to prolong the data retention time, the capacitance of the storage capacitor must be increased by increasing the capacitor area, decreasing the effective dielectric thickness between the capacitor plates, or increasing the dielectric constant (k) of the capacitor dielectric. However, increasing the capacitor area conflicts with the need to shrink the memory cell, and reducing the dielectric thickness is difficult because the dielectric thickness has already been reduced to a practical minimum. Therefore, improving the capacitor dielectric with a high dielectric constant is a way to provide adequate capacitance in view of shrinking cell size.

Conventionally, the most prominent material used to from the capacitor dielectric is $Ta_2O$ or $Al_2O_3$ that facilitates the refining process for making a thinner layer, but fails in high-k dielectric application. Accordingly, various multilayered structures including oxide and nitride, such as $SiO_2/SiN/SiO_2$, $SiN/SiO_2$ and $SiN/SiO_2/SiON$, have been developed for forming the capacitor dielectric.

FIG. 1 is a sectional diagram showing a conventional deep trench capacitor. A DRAM cell comprises a transistor 22 and a deep trench capacitor 20 having a bottom electrode plate 14, a capacitor dielectric 16 and an upper electrode plate 18. The bottom electrode plate 14 can be formed from the $n^+$-doped region in a silicon substrate 10 surrounding a deep trench 12 or from a doped-polysilicon layer that conformally covers the sidewall and the bottom of the deep trench 12. The upper electrode plate 18 is formed by filling the deep trench 12 with a conductive layer.

FIG. 2A is a conventional $SiO_2/SiN/SiO_2$ dielectric structure served as the capacitor dielectric 16. A multi-layered $SiO_2/SiN/SiO_2$ structure, called an ONO structure, has been employed as the capacitor dielectric 16. Because the SiN dielectric constant (k=7.6) is 1.5~2 times larger than that of the $SiO_2$ dielectric constant (k=3.9), the SiN layer in the ONO structure can increase the capacitance of the deep trench capacitor. The $SiO_2$ layer in the ONO structure is employed to repair the damaged interface. Nevertheless, the critical thickness of the ONO structure has a limitation of 5~10 nm, the dielectric constant of the ONO structure only reaches approximately 7, and problems of difficult process, low yield, high process cost, and leakage current occur.

FIG. 2B is a conventional $SiN/SiO_2$ dielectric structure served as the capacitor dielectric 16. A stacked $SiN/SiO_2$ structure, called a NO structure, has been employed to form the capacitor dielectric 16. The NO structure comprises a SiN liner deposited ion the sidewall and bottom of the deep trench 12 by low pressure vapor deposition (LPCVD) and a thin $SiO_2$ layer grown on the SiN liner by re-oxidation process. In the NO structure, the SiN liner with a dielectric constant 1.5~2 times larger than the dielectric constant of the thin $SiO_2$ layer, the thickness of the SiN liner is 40~80 Å and the thickness of the $SiO_2$ layer is 3 nm. Thus, the capacitance of the deep trench capacitor is effectively increased. However, there is still a problem of leakage current caused by the SiN liner. Also, during deposition of the SiN liner, the process gases, such as $SiH_4$ and $NH_3$, cause pinhole structure defects in the SiN liner. Although the $SiO_2$ layer grown on the SiN liner can repair the defects, decrease the pinhole density and reduce leakage current to achieve a preferred distribution of breakdown voltage, the SiN liner is too thin to increase the dielectric constant of the NO structure.

FIG. 2C is a conventional $SiN/SiO_2/SiON$ dielectric structure served as the capacitor dielectric 16. A stacked $SiN/SiO_2/SiON$ structure has been employed to form the capacitor dielectric 16, in which a post oxidation annealing with $NH_3$ is employed on the above-described NO structure to form a SiON layer on the $SiO_2$ layer. The SiON layer contributes a higher dielectric constant to the capacitor dielectric 16, resulting in a significantly improved capacitance. However, the stacked $SiN/SiO_2/SiON$ structure suffers from remarkably leakage current due to the usage of hydrogen-containing gas, such as $NH_3$, in the formation of the SiON layer.

SUMMARY OF THE INVENTION

The present invention provides a SiN/SiON dielectric structure of a capacitor for a DRAM cell to increase dielectric constant and decrease leakage current, thus ensures the electrical reliability of the capacitor dielectric structure.

Accordingly, a semiconductor silicon substrate is provided with a deep trench. Silicon nitride deposition is used to form a silicon nitride layer on the sidewall and bottom of the deep trench. An oxynitride process with wet oxidation and $N_2O$ reactive gas is used to form an oxynitride layer on the silicon nitride layer. A post oxynitride growth annealing is performed on the oxynitride layer.

It is a principle object of the invention to provide a capacitor dielectric structure and a method of forming the same that may be applied to the formation of a deep trench capacitor or a stacked capacitor in DRAM.

It is another object of the invention to provide a SiON layer on a SiN layer to increase the dielectric constant of the capacitor dielectric structure.

Yet another object of the invention is to provide wet oxidation with $N_2O$ as the reactive gas to form a SiON layer on a SiN layer to reduce leakage current.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention provides a stacked SiN/SiON dielectric structure on a silicon substrate to serve as a capacitor dielectric structure, which may be applied to the formation of a deep trench capacitor or a stacked capacitor in DRAM device. The stacked SiN/SiON dielectric structure can increase dielectric constant and reduce leakage current to ensure the electrical reliability of the capacitor dielectric structure.

Figure 1:
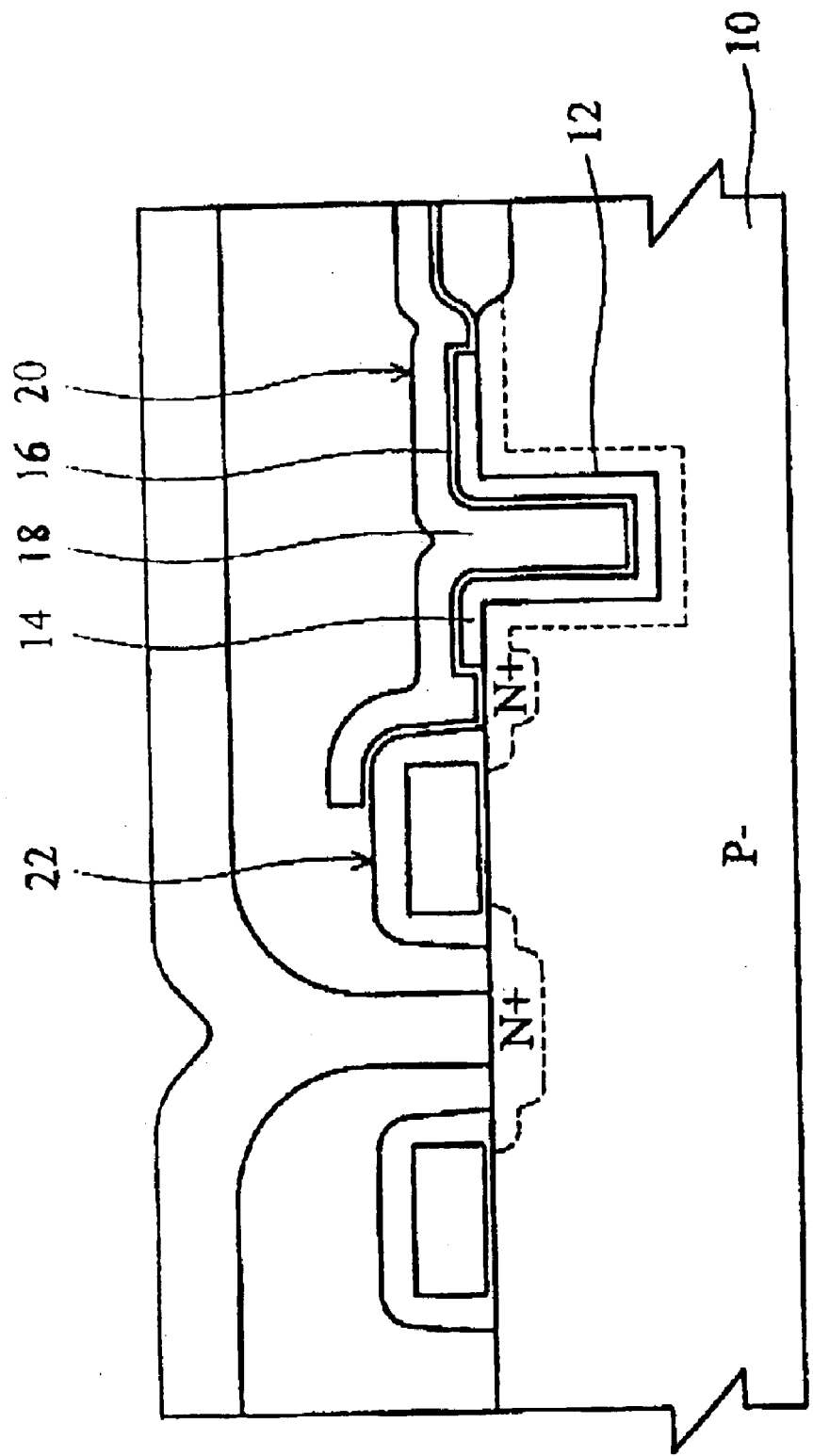
FIG. 1 is a sectional diagram showing a conventional deep trench capacitor.
Figure 2B:
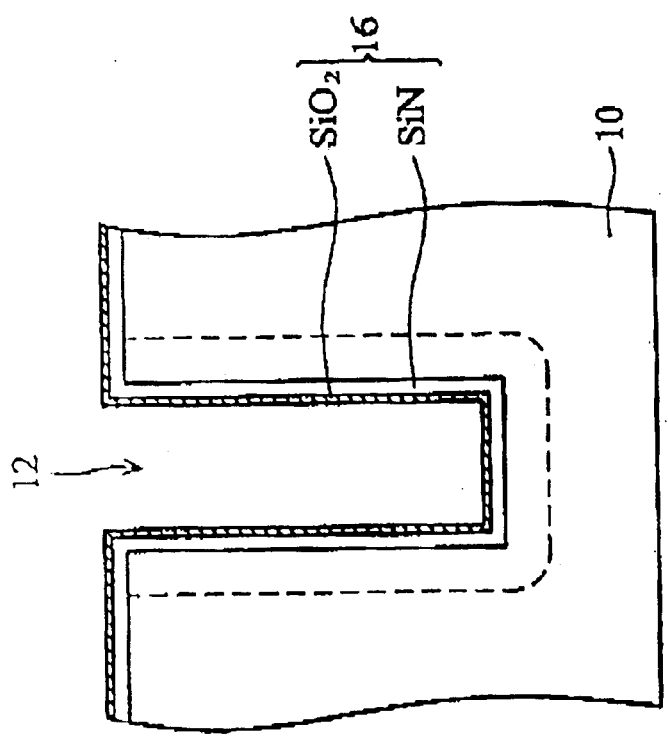
FIG. 2B is a conventional $SiN/SiO_2$ dielectric structure served as the capacitor dielectric.
Figure 2A:
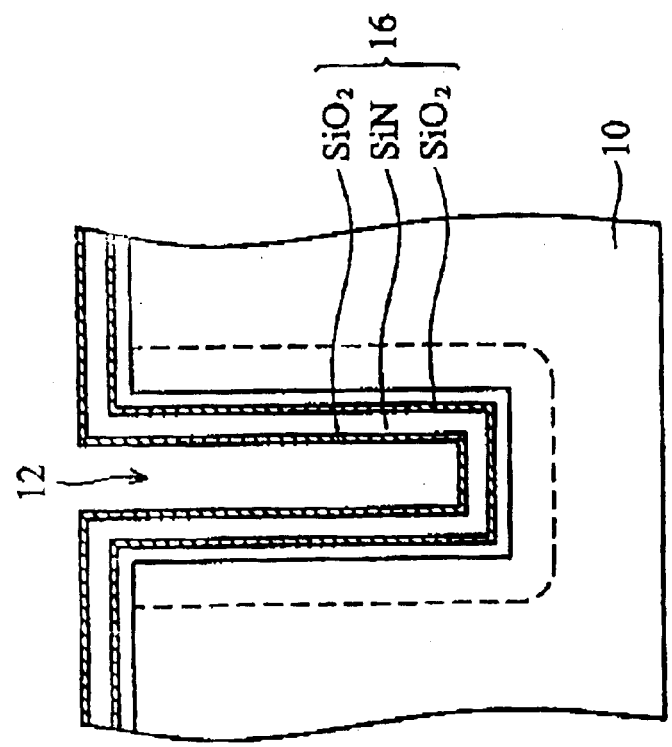
FIG. 2A is a conventional $SiO_2/SiN/SiO_2$ dielectric structure served as the capacitor dielectric.
Figure 2C:
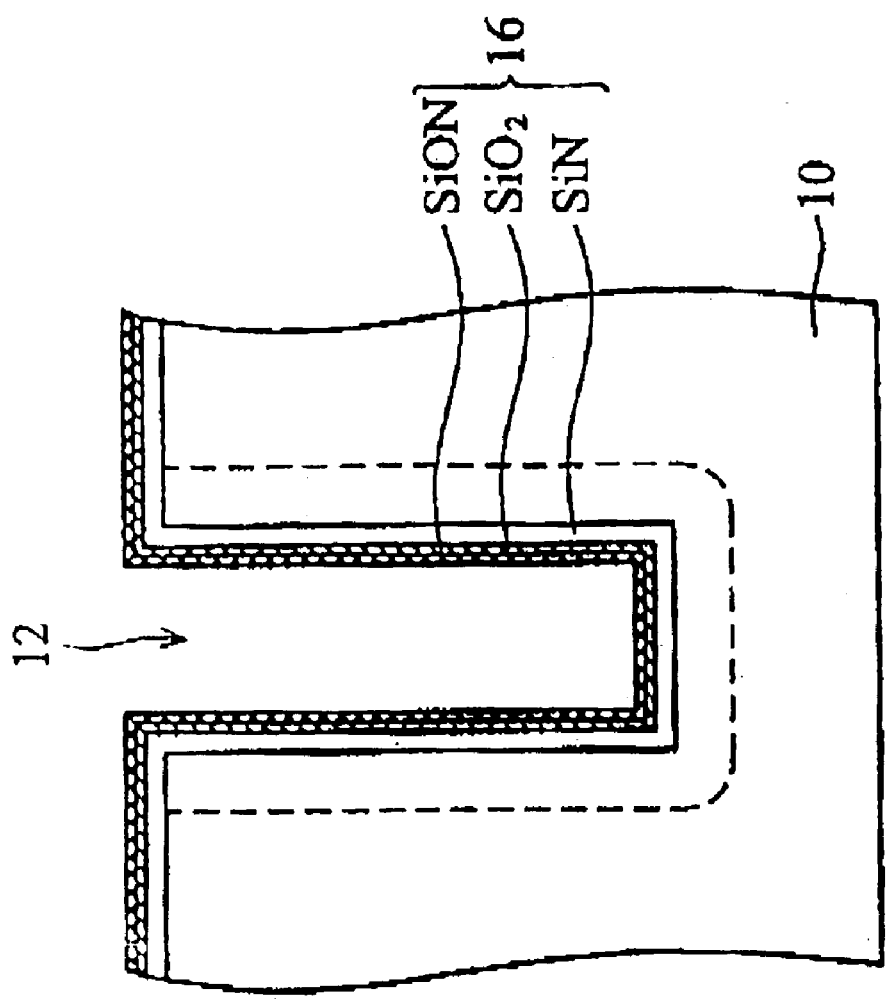
FIG. 2C is a conventional $SiN/SiO_2/SiON$ dielectric structure served as the capacitor dielectric.
Figure 3A:
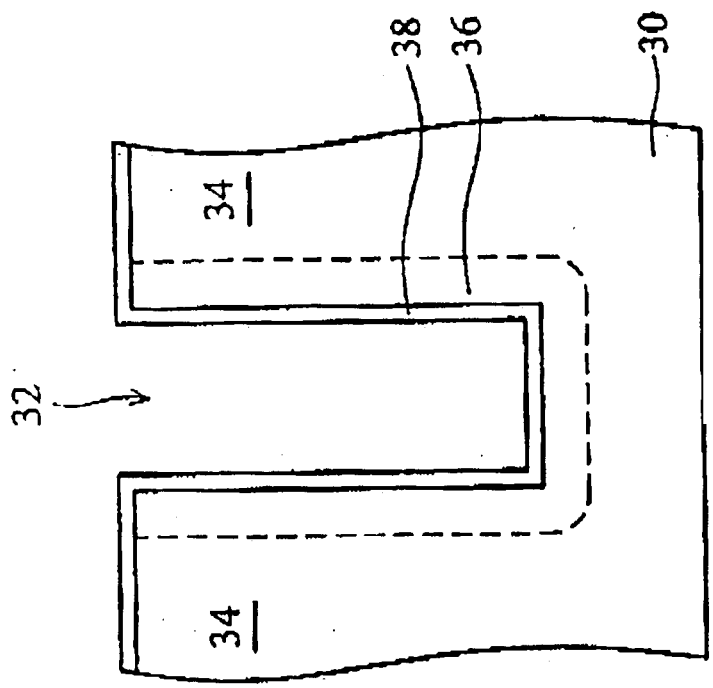
FIGS. 3A~3C are sectional diagrams showing the method of forming the capacitor dielectric structure according to the present invention.
Figure 3B:
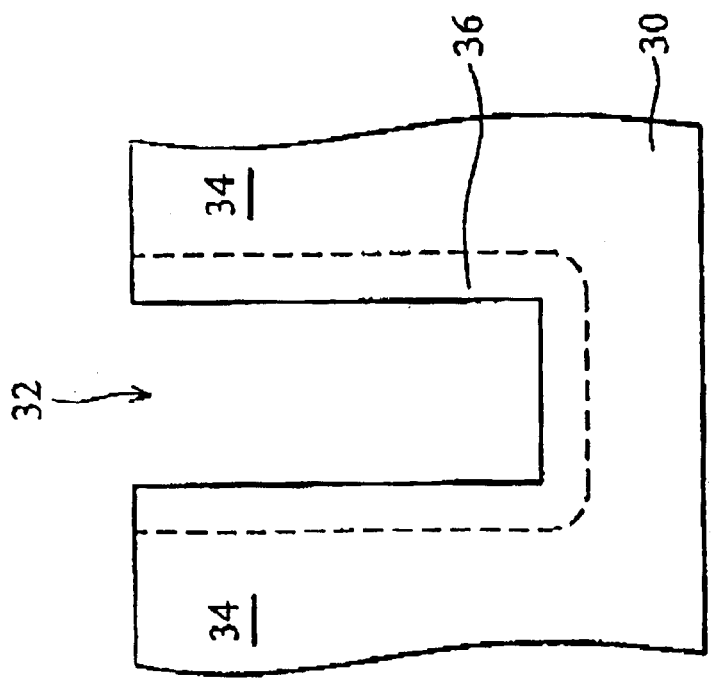
Figure 3C:
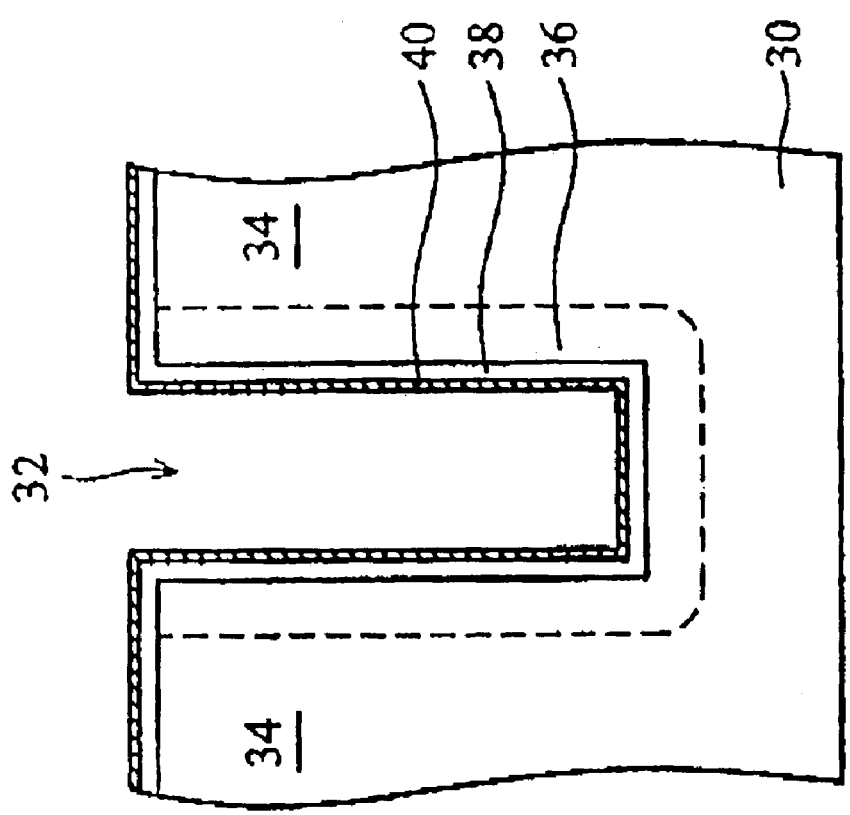
Figure 4:
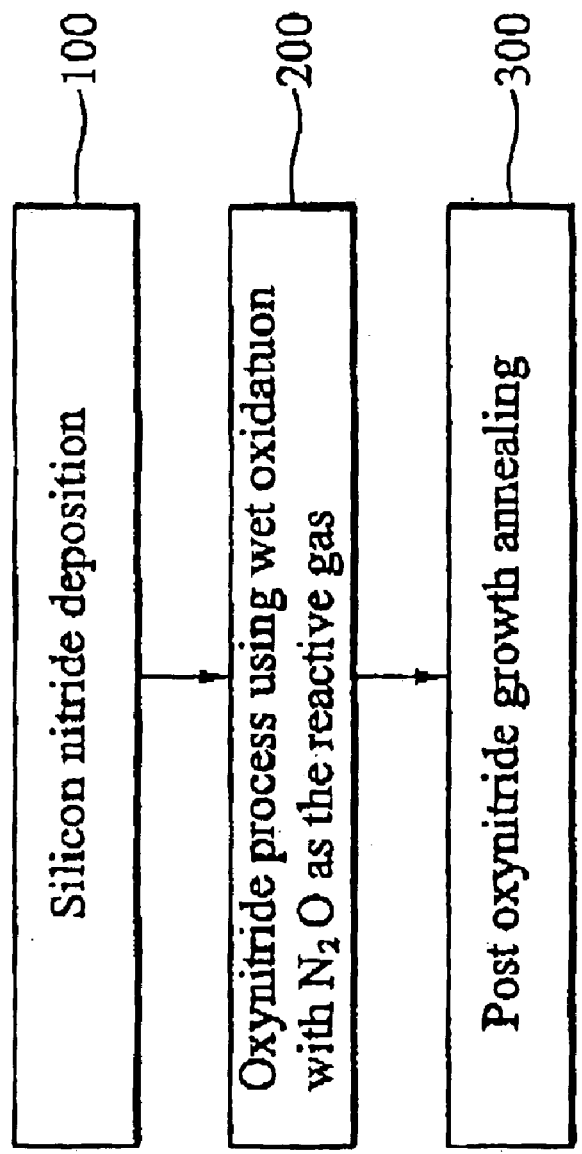
FIG. 4 is a flow diagram showing the method of forming the capacitor dielectric structure according to the present invention.

In the preferred embodiment, the method is applied to the deep trench capacitor process as shown in FIG. 3 and FIG. 4. FIGS. 3A~3C are sectional diagrams showing the method of forming the capacitor dielectric structure according to the present invention. FIG. 4 is a flow diagram showing the method of forming the capacitor dielectric structure according to the present invention.

As shown in FIG. 3A, a semiconductor substrate 30 is provided with a deep trench 32 formed according to process designs and requirements. For example, using photolithography and etching, a plurality of deep trenches in array is formed in the p-type silicon substrate 30, thus the protruding portion of the silicon substrate 30 serves as pillar regions 34. Then, after successively depositing an ASG layer and an oxide layer on the sidewall of the deep trench 32, high-temperature annealing is used in a short term to diffuse As ions of the ASG layer into the silicon substrate 30, resulting in an $n^+$ diffusion region 36 in pillar region 34 surrounding the deep trench 32. The $n^+$ diffusion region 36 serves as a bottom electrode layer of a deep trench capacitor. Next, a pre-cleaning process is used to clean the deep trench 32.

Thereafter, at a step 100, silicon nitride deposition with 650~800 □ deposition temperature is used to form a SiN layer 38 on the sidewall and bottom of the deep trench 32 as shown in FIG. 3B. Preferably, the thickness of the SiN layer 38 is 30~50 Å. Then, at a step 200, an oxynitride process is employed to grow a SiON layer 40 on the SiN layer 38 as shown in FIG. 3C. Preferably, the SiON layer 40 is 220~270 Å thick. Finally, at a step 300, a post oxynitride growth annealing is performed on the SiON layer 40.

In the oxynitride process, a pure oxide of 300 Å thick is grown by wet oxidation and $N_2O$ is in-situ added as the reactive gas so as to form the SiON layer 40, in which the temperature is more than 700□, the process time is more than 30 minutes. Preferably, the process temperature is 800~1000□ (the best is 950□), the process time is 50~90 minutes (the best is 60 minutes), the pressure is 1 atmosphere, and the gas flow rate of $N_2O$ is 2000~4000 sccm.

In the post oxynitride growth annealing, a $N_2O$ treatment is used at a temperature the same as the oxynitride formation temperature. One purpose is to reduce the electron-trapping density so as to strengthen qualities of the SiON layer 40. The other purpose is to incorporate more nitrogen atoms into the SiON layer 40 to effectively increase the dielectric constant thereof.

In Comparison, a conventional oxynitride layer formed by a CVD process with $SiH_2Cl_2(SiH_4)$, $NH_3$ and $N_2O$ as the precursor is inadequate for storage cell dielectric because the conventional oxynitride layer has unstructed properties and electron-trapping issue resulting from the hydrogen-containing precursor. The present invention uses wet oxidation with $N_2O$ as the reactive gas to replace the convention CVD process can improve the property of the SiON layer 40 and prevent the SiON layer form the electro-trapping problem.

By experimental verification, the SiN/SiON dielectric structure gains a thinner oxynitride layer to have higher dielectric constant than that of the conventional $SiN/SiO_2$ structure and the conventional $SiN/SiO_2/SiON$ structure. Also, the SiN/SiON dielectric structure with the use of hydrogen-free gas in the oxynitride formation has a lower leakage current than that of the conventional $SiN/SiO_2/SiON$ structure with the use of $NH_3$ gas in the re-nitridation treatment.

Accordingly, the present invention has thereinafter-described advantages improved by experiments. First, using the wet oxidation with $N_2O$ as the reactive gas on the SiN layer 38, the leakage current phenomenon found in the SiN/SiON dielectric structure is effectively reduced. Second, the thickness of the SiON layer 40 can be reduced to increase the dielectric constant of the capacitor dielectric structure, thus increasing the storage capacity of the deep trench capacitor. Thus, the present invention can both alleviate the leakage current phenomenon and increase the storage capacity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a capacitor dielectric structure, comprising steps of:
   providing a semiconductor silicon substrate;
   using silicon nitride deposition to form a silicon nitride layer on the semiconductor silicon substrate;
   using an oxynitride process with wet oxidation and $N_2O$ reactive gas to form an oxynitride layer on the silicon nitride layer; and
   performing a post oxynitride growth annealing on the oxynitride layer.

2. The method of forming a capacitor dielectric structure as claimed in claim 1, wherein the semiconductor silicon substrate comprises at least a deep trench, and the silicon nitride layer is formed on the sidewall and bottom of the deep trench.

3. The method of forming a capacitor dielectric structure as claimed in claim 1, wherein the capacitor dielectric structure is used for a deep trench capacitor or a stacked capacitor in DRAM device.

4. The method of forming a capacitor dielectric structure as claimed in claim 1, further comprising a step of pre-cleaning the semiconductor silicon substrate before the step of using silicon nitride deposition.

5. The method of forming a capacitor dielectric structure as claimed in claim 1, wherein the thickness of the silicon nitride layer is 30~50 Å.

6. The method of forming a capacitor dielectric structure as claimed in claim 1, wherein in the oxynitride process, the process temperature is 800~1000□, the process time is 50~90 minutes, the pressure is 1 atmosphere, and the gas flow rate of $N_2O$ is 2000~4000 sccm.

7. The method of forming a capacitor dielectric structure as claimed in claim 1, wherein the thickness of the oxynitride layer is 230~270 Å.

8. The method of forming a capacitor dielectric structure as claimed in claim 1, wherein the post oxynitride growth annealing is a $N_2O$ treatment at a temperature the same as the oxynitride process temperature.

* * * * *